(12) United States Patent
Hesterberg et al.

(10) Patent No.: US 11,838,613 B2
(45) Date of Patent: Dec. 5, 2023

(54) METHOD FOR CAPTURING DATA

(71) Applicant: ALLIED VISION TECHNOLOGIES GMBH, Stadtroda (DE)

(72) Inventors: Ralf Steffen Hesterberg, Hamburg (DE); Olaf Funk, Schwarzenbek (DE); Eike Francksen, Bad Schwartau (DE); Erik Busse, Altenburg (DE)

(73) Assignee: ALLIED VISION TECHNOLOGIES GMBH, Stadtroda (DE)

( * ) Notice: Subject to any disclaimer, the term of this patent is extended or adjusted under 35 U.S.C. 154(b) by 154 days.

(21) Appl. No.: 16/607,597

(22) PCT Filed: Apr. 26, 2018

(86) PCT No.: PCT/DE2018/000129
§ 371 (c)(1),
(2) Date: Oct. 23, 2019

(87) PCT Pub. No.: WO2018/196900
PCT Pub. Date: Nov. 1, 2018

(65) Prior Publication Data
US 2021/0289109 A1    Sep. 16, 2021

(30) Foreign Application Priority Data
Apr. 27, 2017    (DE) ...................... 10 2017 004 139.3

(51) Int. Cl.
*H04N 23/54*    (2023.01)
*H05K 1/18*    (2006.01)
(Continued)

(52) U.S. Cl.
CPC ............. *H04N 23/54* (2023.01); *H04N 23/51* (2023.01); *H04N 25/79* (2023.01); *H05K 1/183* (2013.01)

(58) Field of Classification Search
CPC .... H04N 5/2253; H04N 5/379; H04N 5/2252; H05K 1/183
(Continued)

(56) References Cited

U.S. PATENT DOCUMENTS

| 7,700,956 B2 | 4/2010 | Fuergut |
| 8,274,600 B2 * | 9/2012 | Kim ....................... H05K 1/183 |
| | | 257/680 |

(Continued)

FOREIGN PATENT DOCUMENTS

| DE | 102005027892 A1 | 12/2006 |
| EP | 1432240 A1 | 6/2004 |

(Continued)

*Primary Examiner* — Pritham D Prabhakher
(74) *Attorney, Agent, or Firm* — LUCAS & MERCANTI, LLP; Klaus P. Stoffel

(57) ABSTRACT

A device for capturing data in the region of a digital camera. Within a camera housing, electronic components are arranged on at least two printed circuit boards. The circuit boards are joined to form a stack. At least one recess is formed in the region of at least one circuit board on the side associated with another circuit board, to receive components arranged on another circuit board. The digital camera optionally has at least one contour milling in the region of a circuit board for height compensation relative to the image sensor in the digital camera. The mechanical securing mechanism of a connection device of an interface into a fastening element connected to the circuit board stack is integrated with the connecting of the housing parts by a preloaded clip. A method for electrical contacting, by which essential parts of the device for capturing data can be produced.

2 Claims, 16 Drawing Sheets

(51) Int. Cl.
*H04N 23/51* (2023.01)
*H04N 25/79* (2023.01)

(58) Field of Classification Search
USPC .......................................... 348/374
See application file for complete search history.

(56) References Cited

U.S. PATENT DOCUMENTS

| | | | | |
|---|---|---|---|---|
| 8,544,756 | B2* | 10/2013 | Bosquet | G06K 19/07743 |
| | | | | 235/492 |
| 8,623,753 | B1* | 1/2014 | Yoshida | H01L 25/105 |
| | | | | 257/690 |
| 8,970,700 | B2* | 3/2015 | Inoue | H04N 23/52 |
| | | | | 348/148 |
| 9,521,754 | B1 | 12/2016 | Bergman | |
| 9,888,197 | B1* | 2/2018 | Hynecek | H01L 27/14641 |
| 9,888,586 | B2* | 2/2018 | Bang | H01R 4/02 |
| 9,997,554 | B2* | 6/2018 | Grebet | H01L 27/14618 |
| 10,070,088 | B2* | 9/2018 | Ikedo | H04N 5/36961 |
| 10,270,949 | B2* | 4/2019 | Lu | H04N 23/54 |
| 10,602,039 | B2* | 3/2020 | Nalla | H05K 1/0206 |
| 2004/0218084 | A1 | 11/2004 | Komoro | |
| 2005/0085011 | A1* | 4/2005 | Lee | H05K 1/021 |
| | | | | 257/E23.125 |
| 2009/0079863 | A1* | 3/2009 | Aoki | H04N 23/54 |
| | | | | 348/E5.026 |
| 2010/0025801 | A1* | 2/2010 | Han | H01L 27/14634 |
| | | | | 257/E31.113 |
| 2010/0141825 | A1* | 6/2010 | Kim | H01L 27/14618 |
| | | | | 156/305 |
| 2011/0242407 | A1* | 10/2011 | Lee | H04N 23/55 |
| | | | | 348/374 |
| 2011/0298925 | A1* | 12/2011 | Inoue | H04N 5/2254 |
| | | | | 348/148 |
| 2012/0138691 | A1* | 6/2012 | Bosquet | G06K 19/07743 |
| | | | | 156/60 |
| 2012/0141114 | A1* | 6/2012 | Gooi | G03B 17/12 |
| | | | | 156/60 |
| 2012/0248580 | A1* | 10/2012 | Matsugai | H01L 27/1469 |
| | | | | 257/621 |
| 2013/0070147 | A1* | 3/2013 | Gooi | H04N 23/57 |
| | | | | 257/E31.127 |
| 2013/0134576 | A1* | 5/2013 | Hayashi | H01L 27/1464 |
| | | | | 257/734 |
| 2013/0271649 | A1* | 10/2013 | Halliday | H04N 23/55 |
| | | | | 348/374 |
| 2013/0329054 | A1* | 12/2013 | Hoelter | H04N 5/33 |
| | | | | 348/164 |
| 2014/0339668 | A1* | 11/2014 | Arima | H01L 23/4006 |
| | | | | 257/443 |
| 2015/0001533 | A1* | 1/2015 | Kuwabara | H01L 29/78696 |
| | | | | 257/43 |
| 2015/0155247 | A1* | 6/2015 | Yan | H01L 25/0657 |
| | | | | 257/776 |
| 2015/0187745 | A1* | 7/2015 | Chiu | H01L 24/97 |
| | | | | 257/737 |
| 2015/0279805 | A1* | 10/2015 | Karhade | H01L 21/76883 |
| | | | | 257/737 |
| 2015/0319378 | A1* | 11/2015 | Hoelter | H04N 23/51 |
| | | | | 348/164 |
| 2016/0116695 | A1* | 4/2016 | Nekado | G02B 6/421 |
| | | | | 385/14 |
| 2016/0134796 | A1* | 5/2016 | Kaneko | H04N 23/57 |
| | | | | 348/208.11 |
| 2016/0190192 | A1* | 6/2016 | Grebet | H01L 27/14625 |
| | | | | 250/208.1 |
| 2016/0198110 | A1* | 7/2016 | Ikedo | H04N 5/3698 |
| | | | | 348/222.1 |
| 2016/0255257 | A1* | 9/2016 | Lu | H04N 23/55 |
| | | | | 156/64 |
| 2017/0080255 | A1* | 3/2017 | Law | G10K 11/346 |
| 2017/0179101 | A1* | 6/2017 | Yan | H01L 23/13 |
| 2017/0202093 | A1* | 7/2017 | Bang | H01R 4/02 |
| 2018/0084647 | A1* | 3/2018 | Nalla | H05K 3/4697 |
| 2018/0234594 | A1* | 8/2018 | Lim | H04N 5/2252 |
| 2019/0132954 | A1* | 5/2019 | Kim | H05K 1/0254 |
| 2020/0306893 | A1* | 10/2020 | Suzuki | B23K 35/3613 |

FOREIGN PATENT DOCUMENTS

| | | |
|---|---|---|
| GB | 2421869 A | 7/2006 |
| WO | 9303575 A1 | 2/1993 |
| WO | 2005001942 A1 | 1/2005 |

* cited by examiner

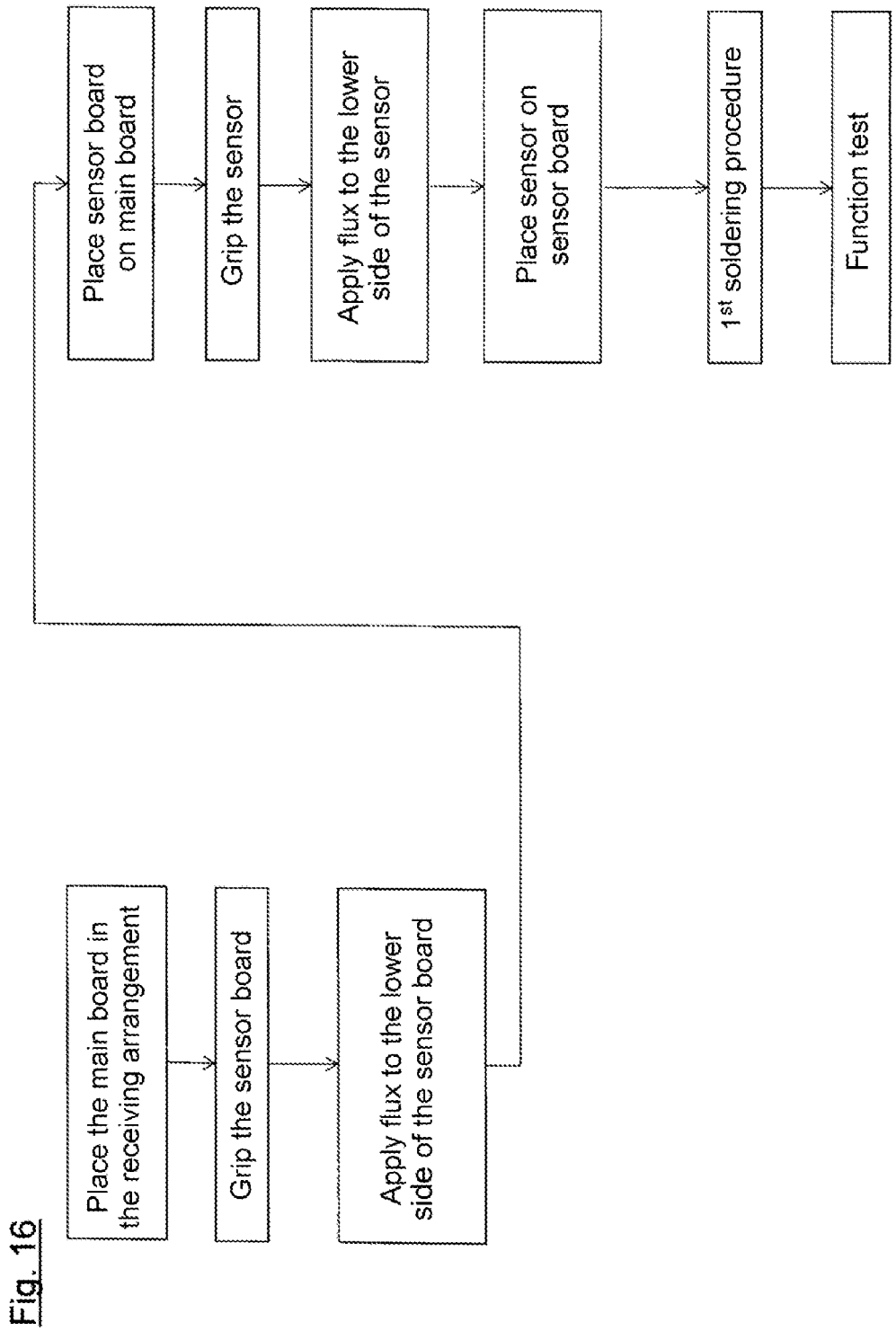

METHOD FOR CAPTURING DATA

CROSS-REFERENCE TO RELATED APPLICATIONS

The present application is a 371 of International application PCT/DE2018/000129, filed Apr. 26, 2018, which Maims priority of DE 10 2017 004 139.3, filed Apr. 27, 2017, the priority of these applications is hereby claimed and these applications are incorporated herein by reference.

BACKGROUND OF THE INVENTION

The invention relates to a device for capturing data in the sense of a digital camera and a method for producing a device for capturing data. Digital cameras of this type generally comprise at least one image sensor or transformation chip that transforms the received optical information into allocated electrical signals. By way of example, digital cameras having so-called CCD chips are known.

A digital camera of this type typically comprises a camera housing that supports an optical system that comprises multiple lenses. The sensor for transforming the visual data into electrical data is arranged downstream of this optical system. In addition, a digital camera of this type generally comprises control elements and storage elements. Furthermore, at least one interface for communication with other devices is frequently provided. A plurality of data is transmitted between diverse electronic components within the digital camera.

The basic construction of a digital camera of this type is described by way of example in EP 1432240 A1. Solutions for the arrangement of the sensor within the camera housing are explained in DE 10 2005 027 892 A1.

There is a plurality of applications for digital cameras of this type, both in the private as well as commercial sector. Corresponding digital cameras are also increasingly being used for production control procedures and/or in conjunction with industrial robots.

In the case of many applications, a particularly high quality is demanded of the digital cameras and the optical information that is provided, furthermore the digital cameras are however to also be accordingly provided relatively inexpensively and at a particularly constant high quality.

Furthermore, there is a demand for increasingly smaller cameras, as a result of which the installation space that is available within a camera housing is further limited.

It is advantageous for a cost-optimized procedure for producing digital cameras if components, such as by way of example the housing and optical components, for various camera types may be used that differ by way of example in the image sensor that is used. However, generally a different installation height accompanies different image sensors with the result that a professional arrangement of the image sensor with respect to the lens of the camera requires a complex procedure.

In accordance with the prior art, a connecting device of an interface for communication with other devices is embodied, by way of example in the form of an I/O plug connector, as a separate electrical and mechanical connecting device.

The electrical connecting device is generally soldered onto a circuit board, while the mechanical connecting device is realized on the camera housing. In order to ensure a correct orientation of the mechanical connecting device and the electrical connecting device with respect to one another, it is therefore necessary for the circuit board that supports the electrical connecting device to be oriented in a defined manner with respect to the camera housing. This requires separate circuit boards within the digital camera since the sensor circuit board comprises different orientation requirements than the circuit board that supports the connecting device. Furthermore, the known construction requires a flexible connection between the individual circuit boards, which is costly and possibly causes problems with the signal integrity.

The combination of the above-mentioned requirements cannot yet be fulfilled using the hitherto known methods and devices.

SUMMARY OF THE INVENTION

One object of the invention is therefore to realize an embodiment of the elements, which are arranged in a camera housing, in such a manner that the space requirement is optimized.

This object is achieved in accordance with the invention by virtue of the fact that the circuit boards of a digital camera are embodied in such a manner that at least one of the circuit boards comprises at least one depression that is realized by way of example by means of depth milling, said depression receiving at least a part of the components that are arranged on another circuit board of the digital camera in the at least one pocket that is embodied in this manner.

A further object of the invention is to construct a digital camera in such a manner that it is also possible to always use the same camera housing having the associated optical components, such as by way of example a filter, a glass cover or a lens, when various image sensors are used for various model ranges of the digital camera.

This object is achieved in accordance with the invention by virtue of the fact that the circuit board/circuit boards that determine the spacing of the image sensor with respect to the lens comprises/comprise an outline milling that reduces the thickness of this circuit board or the thickness of the circuit board stack in such a manner that in conjunction with a support that is arranged on the housing inner side of the digital camera and an adhesive between the circuit board and the support it is possible to adjust the spacing of the image sensor with respect to the lens in such a manner that the image sensor may be arranged in a defined plane in relation to the lens.

A further object of the invention is to construct the interfaces of a digital camera for communication with other devices in such a manner that it is possible to rule out an erroneous orientation with respect to one another of electrical plug contacts and the mechanical connecting devices that are allocated to an interface.

This object is achieved in accordance with the invention by virtue of the fact that the camera-side connecting devices of an interface are not realized in accordance with the prior art as electrical contacts that are arranged on a circuit board and mechanical connecting devices that are arranged on the housing but rather said camera side connecting devices are arranged together on a circuit board of the digital camera.

A further object of the invention is to realize a reversible connection of at least two parts of the camera housing, which may be rapidly released and closed and which ensures a reliable connection of the housing parts.

This object is achieved in accordance with the invention by virtue of the fact that the connection of the housing parts is realized with the aid of at least one clamp that by virtue of its specific shape comprises a pre-stressing arrangement that generates a securing restoring force that secures the connection of the housing parts.

A plurality of realization possibilities with regard to the construction and technical aspects of the method are explained below that may be realized selectively individually or in combination with one another.

A digital camera in accordance with the invention in one preferred embodiment comprises a multi-part camera housing. At least two circuit boards are arranged within the camera housing, said circuit boards supporting at least one image sensor and the associated and also further electrical components.

The at least two circuit boards are connected to one another by means of soldering to form a circuit board stack. In this case, one of the circuit boards is advantageously embodied as a sensor circuit board that supports at least the image sensor, and another circuit board is embodied as a main circuit board that supports at least one main chip as the control element, said main chip being advantageously embodied as an ASIC, an FPGA or a processor.

At least one of the circuit boards comprises on its side that is facing another circuit board at least one depression that forms a pocket between the respective circuit boards if the circuit boards are connected so as to form a circuit board stack and it is possible for said pocket to receive the components that are arranged on the other circuit board and are a corresponding height. The at least one depression is advantageously realized as a depth-milled depression.

A construction of the circuit board stack from three circuit boards is also conceivable, wherein advantageously one circuit board is embodied as a sensor circuit board, one circuit board is embodied as a connecting circuit board and one circuit board is embodied as a main circuit board. The depth-milled depression for embodying pockets between the circuit boards may be arranged in this exemplary embodiment entirely or at least in part in the connecting circuit board with the result that it may be possible to combine various sensor circuit boards and main circuit boards with one another using a cost-effective adjustment of the connecting circuit board. The depth-milled depression may optionally additionally extend into the sensor circuit board. Furthermore, it is possible by means of using a connecting circuit board of the same thickness as the other circuit boards to realize pockets having greater heights with the result that it is also possible to receive components having a greater installation height.

Furthermore, a digital camera in accordance with the invention in one advantageous embodiment comprises in the region of at least one circuit board an outline milling that reduces the thickness of the circuit board or the thickness of the circuit board stack.

The outline milling is arranged particularly advantageously on the outer edge region of the sensor circuit board and defines the position of the image sensor in the digital camera in conjunction with the thickness of the sensor circuit board, the installation height of the image sensor, a support for the sensor circuit board or the circuit board stack, said support being arranged within the camera housing, and in conjunction with the thickness of the adhesive between the support and circuit board stack.

In the case of one embodiment of a digital camera in accordance with the invention comprising at least one circuit board having at least one depression for receiving components that are arranged on another circuit board, and comprising at least one circuit board having at least one outline milling for realizing a position adjustment of the image sensor in the digital camera, a realization of the circuit board stack from three circuit boards that are embodied as a sensor circuit board, a connecting circuit board and a main circuit board is particularly advantageous since the above-mentioned characteristics may be realized in such a manner that only a maximum of one type of milling is required for each circuit board, as a result of which the production costs may be reduced.

In one advantageous embodiment of a digital camera in accordance with the invention, at least one fastening element, by way of example embodied as a so-called fastener, is arranged on the circuit board stack so as to realize at least one connecting device of an interface for communication with other devices.

A fastener is a fastening element that realizes the mechanical connecting devices of at least one connecting device of at least one interface and that is connected in the region of the electrical connecting device of the at least one interface to the respective circuit board.

By way of example, the electrical connecting device of an interface is realized as a socket that comprises the electrical plug contacts, and the fastener comprises an additional screwing device or clamping device that mechanically secures the plug connection of the interface.

A fastener may be realized by way of example in a 90° or in a 180° embodiment in order to accordingly arrange a connecting device of an interface on the side or on the rear of the camera housing. In this case, the angle describes the plugging direction of the connecting device in relation to the stack direction of the circuit board stack.

Furthermore, a digital camera in accordance with the invention in one advantageous embodiment comprises at least one clamp for connecting the parts of the camera housing, said clamp by virtue of its shape comprising a pre-stressing arrangement that secures the connection of the parts of the camera housing.

It is particularly advantageous that the camera housing is divided into two parts that comprise in the region of their connecting sides a structure that lies against the outer side, said structure forming a receiving arrangement for the at least one clamp.

The at least one clamp is produced in one advantageous embodiment from a metal sheet and comprises in its longitudinal direction a curvature that is realized by way of example by means of one or multiple bends in the transverse direction of the clamp. This curvature realizes a pre-stressing arrangement of the clamp. The clamp comprises on the longitudinal-side ends respectively a fastening device that is realized by way of example by means of the clamp being bent in regions. On one end of the clamp, the bend in conjunction with a housing-side receiving structure realizes an undercut and on the other end realizes a resilient element.

The receiving structure on the parts of the camera housing is advantageously realized by means of respectively an edge that is arranged on a housing part, said edge being arranged approximately parallel to the connecting plane of the housing parts and behind which edge the clamp may be fixed.

The at least one clamp may be positioned in the region of the housing-side receiving structures so as to connect the housing parts and the clamp may expand in the longitudinal direction by means of applying force to the curvature of the clamp, the bent ends of the clamp may then be positioned behind the allocated edges of the housing parts. The restoring force that occurs on account of the pre-stressing arrangement of the clamp acts in a direction that secures the connection.

Furthermore, the invention relates to a method for electrically contacting electronic components on at least two circuit boards of a digital camera in which at least one electronic chip is soldered to at least one circuit board and in which the at least two circuit boards are soldered to one another, characterized in that the soldering procedure is performed in such a manner that the at least one electronic chip is only heated once by means of a soldering procedure.

In particular in the case of the contacting method in accordance with the invention, it is intended that the at least one temperature-sensitive image sensor is preserved during the soldering procedure.

In a first step, the sensor circuit board with the exception of the at least one image sensor is therefore populated and soldered consecutively on the upper side and lower side. In a second step, the main circuit board is populated and soldered consecutively on the upper side and lower side and where applicable in a further step the connecting circuit board is populated and soldered. After the respective populating procedure and soldering procedure, the circuit boards are deposited in circuit board type-dependent trays. The circuit boards that are required for a circuit board stack are extracted from these trays.

The circuit board stack is formed by means of extracting the main circuit board from the allocated tray and positioning the main circuit board, subsequently extracting the circuit board that is to be connected to the main circuit board, by way of example provided by means of a connecting circuit board or a sensor circuit board, applying flux to at least one of the circuit boards that are to be connected, placing the circuit board that is to be connected on the main circuit board, repeating the above-mentioned steps after extracting the circuit board that is to be connected until the sensor circuit board is placed on the stack that is formed in this manner, subsequently applying flux to the sensor circuit board and/or to the lower side of the image sensor and placing the image sensor on the sensor circuit board and the actual soldering procedure, advantageously realized as a reflow cycle, by means of which the individual circuit boards of the circuit board stack are connected to one another and form a contacting arrangement with one another and the image sensor is connected to and forms a contacting arrangement with the sensor circuit board.

The features in accordance with the invention render it possible to produce a digital camera having a particularly small installation space by virtue of the fact that it is rendered possible to realize the entire electronic system of the camera including the connecting devices of the communications interfaces on only one circuit board stack that may be precisely positioned in the camera according to the given requirements of the orientation of the image sensor.

BRIEF DESCRIPTION OF THE DRAWING

Exemplary embodiments of the invention are illustrated schematically in the drawings. In the drawings:

FIG. 11 having a further alternative as an image sensor, FIG. 16 illustrates a further flow diagram for illustrating a production flow when the entire arrangement of the circuit boards of a circuit board stack in accordance with the invention is produced.

DETAILED DESCRIPTION OF THE INVENTION

Figure 1:
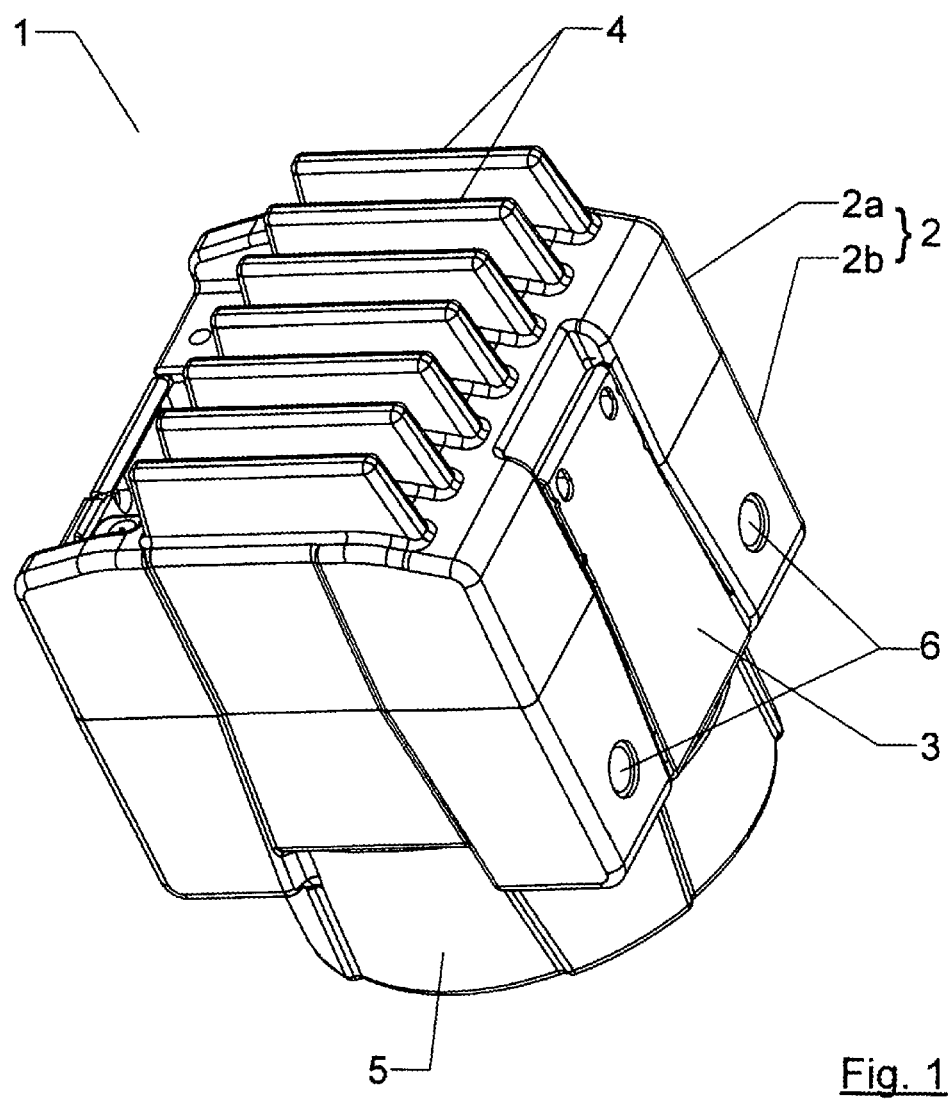
FIG. 1 illustrates a perspective view of a camera housing.

The basic construction of a camera housing (2) of a digital camera (1) in accordance with the invention is apparent in the perspective view in FIG. 1. The camera housing (2) is embodied from a housing lower part (2b) and a housing upper part (2a). The housing lower part (2b) and the housing upper part (2a) are connected to one another with the aid of two clamps (3). The clamps (3) are embodied from an elastic and resilient material, by way of example steel.

In particular the use of cast zinc has proven itself as expedient as a material for the production of the housing lower part (2b) and/or the housing upper part (2a) since as a consequence it is possible to achieve delicate structures having relatively thin wall thicknesses.

A plurality of cooling ribs (4) are arranged in the region of an upper side of the housing upper part (2a) in order to be able to dissipate heat to a surrounding area. The housing lower part (2b) comprises a lens holder (5) that is realized as a circumferential flange and limits an access opening to the housing lower part (2b). Optical components, by way of example one or multiple optical lenses or a filter are arranged in an interior of the camera housing (2) adjacent to the lens holder (5).

Furthermore, the camera housing (2) comprises two assembly devices (6) in the region of the housing lower part (2b), said assembly devices being realized in the illustrated embodiment as screw threads and it being possible to use said assembly devices by way of example so as to connect the digital camera (1) to a tripod or a holder.

Figure 2:
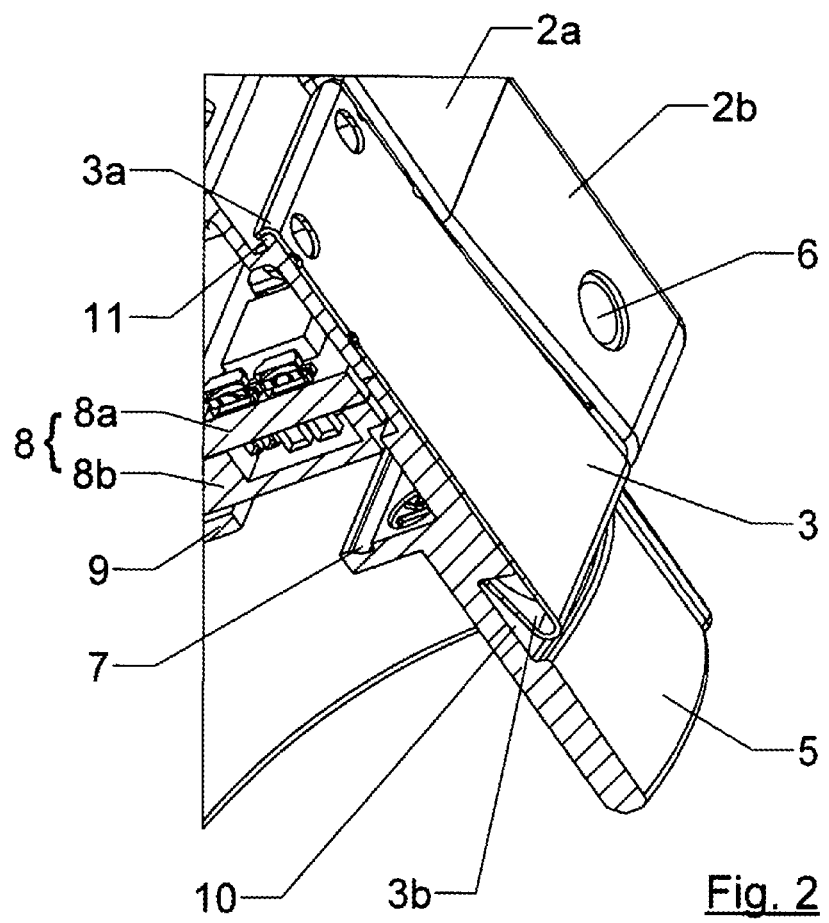
FIG. 2 illustrates an enlarged view of an extract of a digital camera in accordance with the invention in the region of a clamp for connecting a housing lower part to a housing upper part and for pre-stressing these components relative to one another.

FIG. 2 illustrates an enlarged and in part sectional view of the digital camera (1) in the region of the assembled clamp (3).

The housing interior is illustrated in sections in the left-hand side region of the figure. A connecting piece (7) protrudes on the inner side on the lower housing part (2b), said connecting piece comprising a supporting profile for a filter. The circuit board stack (8) is arranged above said supporting profile, said circuit board stack in the illustrated embodiment comprising two circuit boards that are connected to one another, said circuit boards being embodied as a main circuit board (8a) and as a sensor circuit board (8b). The sensor circuit board (8b) supports on its side that is lying at the bottom in the illustration an image sensor (9).

In FIG. 2, it is furthermore apparent that the clamp (3) is provided in its end regions with material bendings. The bending region (3b) that is illustrated in FIG. 2 in the lower-right hand side is used for a first mounting arrangement behind an allocated profile (10) of the housing lower part (2b). The further bending region (3a) that is apparent in FIG. 2 in the upper left-hand side on the clamp (3) is used so as to clip into a mating profile (11) of the housing upper part (2a).

Figure 3:
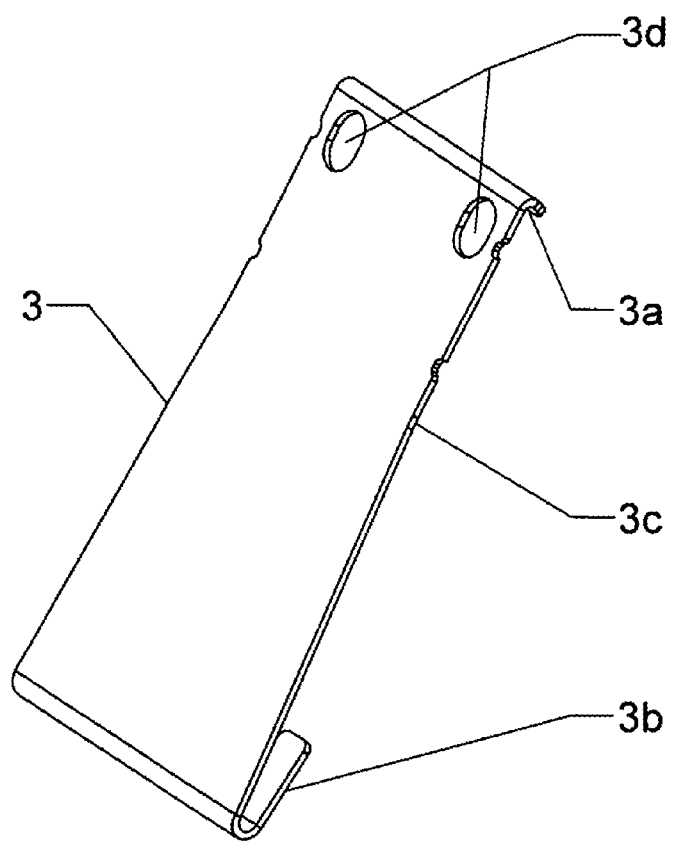
FIG. 3 illustrates an enlarged perspective view of the clamp in accordance with FIG. 1.

The perspective illustration in FIG. 3 illustrates the construction of the clamp (3) that comprises in the direction of its longitudinal extent a slightly angled bend (3c). In one assembled state, the bend (3c) extends approximately in a region of the transition from the housing lower part (2b) to the housing upper part (2a). The bend (3c) supports an elastic elongation of the clamp (3) during a clipping-in procedure.

The bending region (3a) that is allocated to the housing upper part (2a) forms in an assembled state an undercut with the mating profile (11) of the housing upper part (2a). The bending region (3b) that is allocated to the housing lower part (2b) is embodied as a divided resilient element. The division renders it possible to make an adjustment to suit the round outer contour of the lens carrier (5) in the region of the profile (10).

Furthermore, the clamp (3) comprises two assembly aids (3d) that are realized as recesses in the clamp (3).

Bonding or screwing arrangements on the housing (2) are avoided by means of using the clamp (3). Furthermore, the assembly procedure may be implemented with a particularly small outlay of time.

Figure 4:
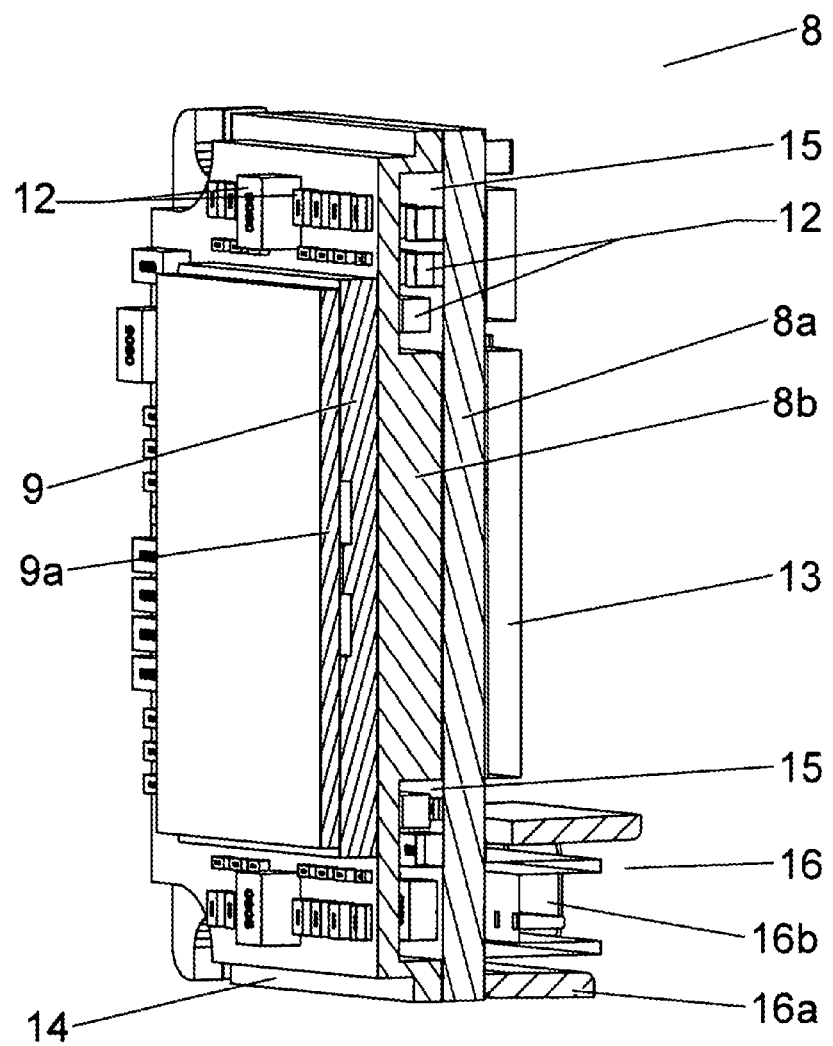
FIG. 4 illustrates an enlarged and in part sectional view of a circuit board stack in accordance with the invention.

FIG. 4 illustrates a cross section of the circuit board stack (8). The circuit board stack (8) comprises two circuit boards that are embodied as a main circuit board (8a) and as a sensor circuit board (8b).

In addition to the image sensor (9) that comprises a sensor glass (9a), electronic components (12) are arranged both on the sensor circuit board (8b) as well as on the main circuit board (8a) and said electronic components may be embodied by way of example as capacitors, resistors, diodes and/or ICs.

Moreover, the main circuit board (8a) supports the control element of the digital camera (1), said control element being embodied as a main chip (13), that is realized in the illustrated example as an ASIC.

The sensor circuit board (8b) comprises on its sides lying at the top and bottom in FIG. 4 an outline milling (14) via which it is possible to influence the position of the image sensor (9) in the digital camera (1). Furthermore, the sensor circuit board (8b) comprises two depressions (15) that are realized as depth-milled depressions and that form pockets between the main circuit board (8a) and the sensor circuit board (8b), said pockets being used to receive components (12) between the circuit boards.

By means of a metallization procedure in the region of the surfaces of the circuit boards that delimit the depressions (15), it is possible to achieve an electromagnetic shielding arrangement of the components (12) that are received within a pocket that is embodied in this manner.

In addition to the main chip (13), a connecting device of an interface (16) is arranged on the main circuit board (8a), said connecting device comprising a fastening element (16a) and an I/O plug connector (16b).

Figure 5:
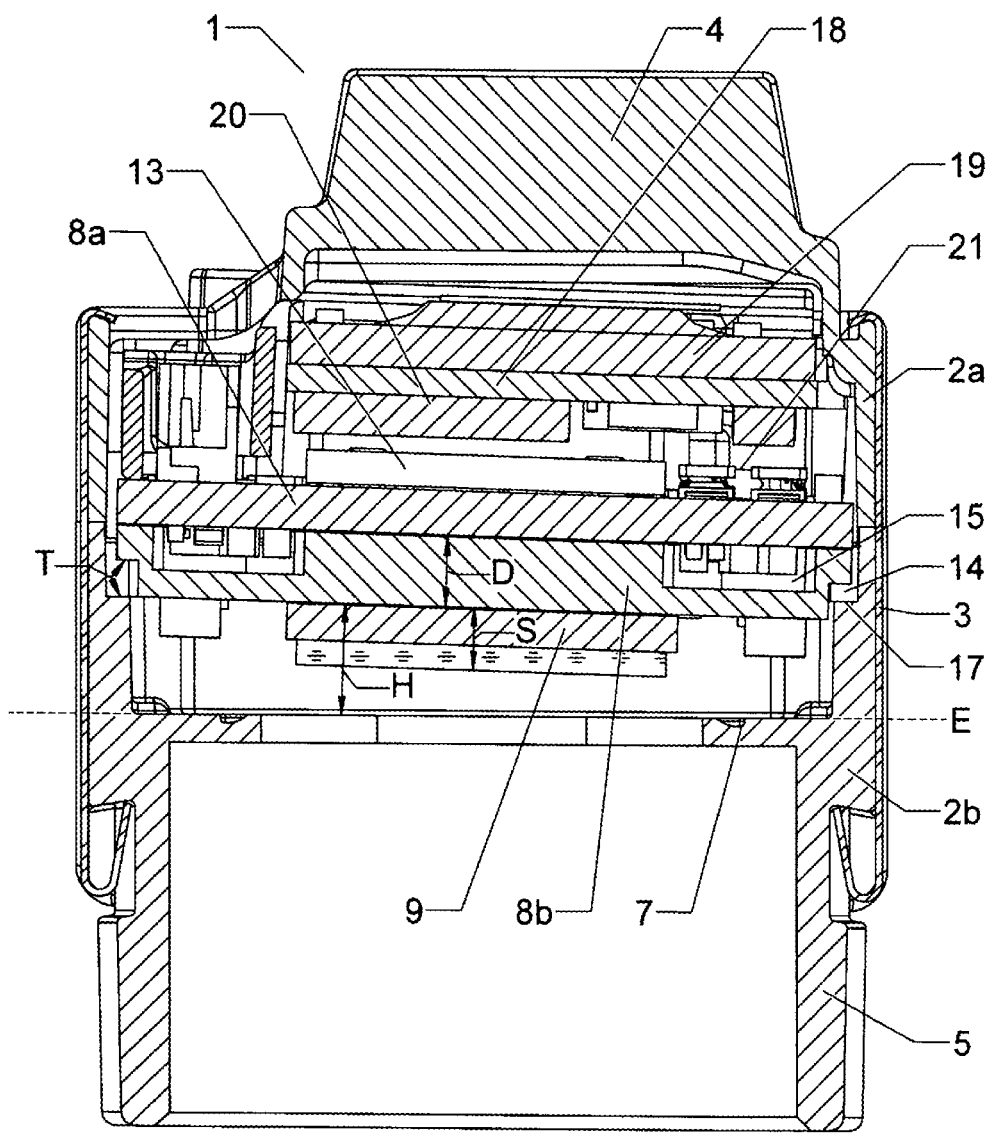
FIG. 5 illustrates a vertical longitudinal section through components that are arranged within the camera housing.

FIG. 5 illustrates in a cross sectional view of the digital camera (1) the use of outline millings (14) in the region of circuit boards in order as a consequence to be able to compensate for height. Initially, the use of the clamps (3) so as to connect the housing lower part (2b) and the housing upper part (2a) is also apparent in this cross sectional view. The thickness (S) of the image sensor (9) is however provided as variable in each individual case for various image sensors (9) that may be used in a digital camera (1) in accordance with the invention. It is possible while using in accordance with the invention an outline milling (14) of the depth (T) to compensate for height in such a manner that the height (H), which defines the position of the image sensor (9) with respect to a fixed reference plane (E) of the digital camera (1), may be adjusted according to the system requirements.

In this case, a rough adjustment may be performed by means of selecting the sensor circuit board (8b) that comprises a thickness (D) that corresponds to the selection. A further adjustment of the height (H) may be performed by means of the adhesive that is used during the procedure of assembling the circuit board stack (8) in the camera housing (2). In this case, the adhesive is applied to an allocated support (17) in the housing interior and/or the sensor circuit board (8b) in the region of the outline milling (14) and the sensor circuit board (8b) is oriented in the camera housing (2). The adhesive is subsequently hardened and connects the sensor circuit board (8a) in the region of the support (17) to the camera housing (2). However, this possibility is only possible in a particularly limited range as a result of the adhesive contracting during the hardening procedure and a temperature-dependent expansion of the adhesive after the hardening procedure.

Furthermore, FIG. 5 illustrates the use of an expansion circuit board (18) that supports an additional electronic chip (19), by way of example embodied as an FPGA, and a storage device element (20), by way of example in the form of at least one RAM module, and that may be connected via connecting plugs (21) to the main circuit board (8a).

Figure 6:
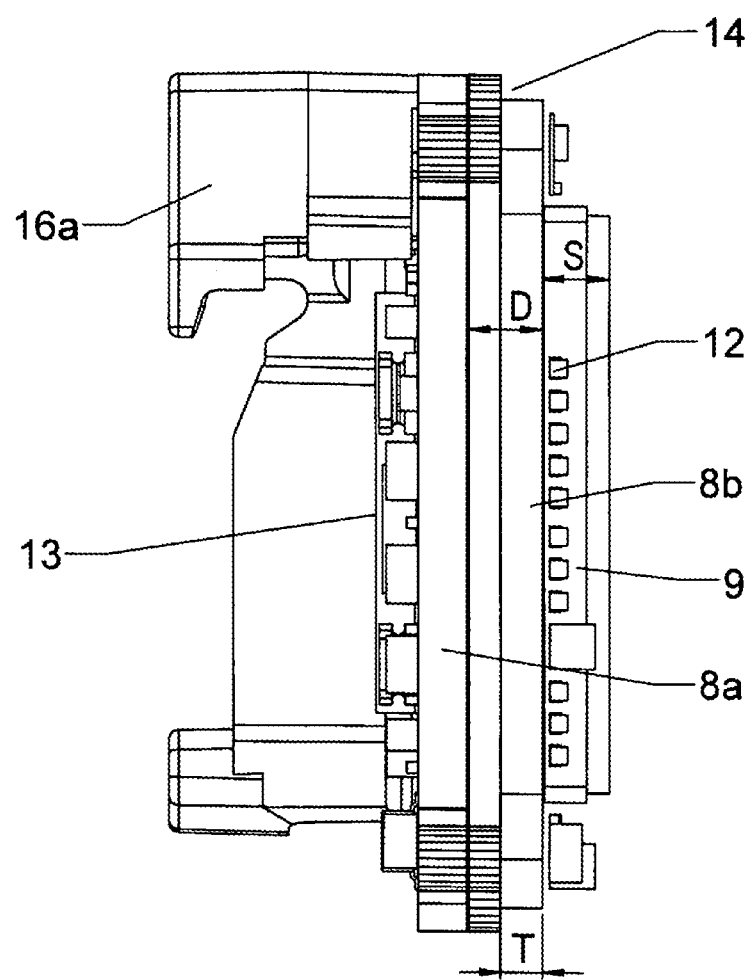
FIG. 6 illustrates a side view of a circuit board stack, in accordance with the invention, of a digital camera.

FIG. 6 again illustrates in addition to FIG. 5 the arrangement of the thickness (D) of the sensor circuit board (8b) and the thickness (S) of the image sensor (9) and also the depth (T) of the outline milling (14). A side view of a circuit board stack (8) in accordance with the invention is illustrated comprising a main circuit board (8a) and also a sensor circuit board (8b).

Figure 7:
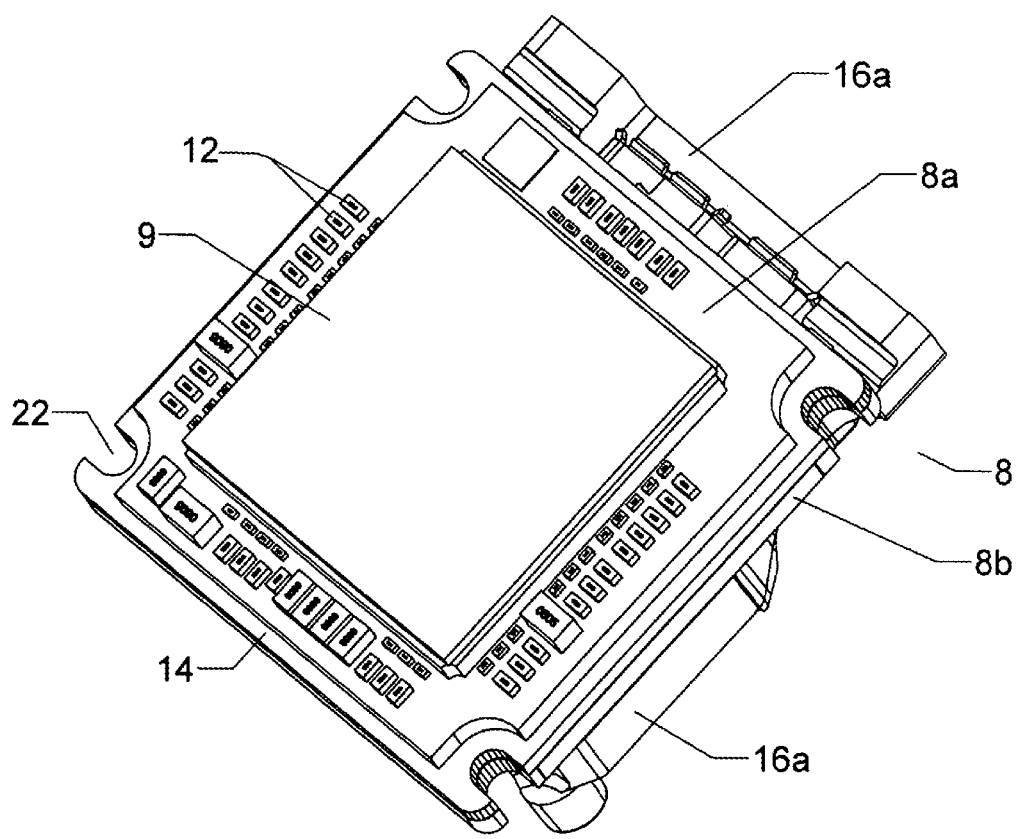
FIG. 7 illustrates a perspective plan view of a circuit board stack, in accordance with the invention, of a digital camera.

FIG. 7 illustrates in a perspective view the arrangement of an image sensor (9) on a sensor circuit board (8b) of a circuit board stack (8), in accordance with the invention, of a digital camera (1). Furthermore, a plurality of electronic components (12) is apparent that are arranged on the sensor circuit board (8b). A fastening element (16a) is arranged in the region of the main circuit board (8a) and it is possible using said fastening element to realize the mechanical securing arrangement of two connecting devices of two interfaces (16).

A two-part or multi-part embodiment of the fastening element (16a) may also be realized in accordance with the invention using an allocation of a part to respectively at least one interface (16).

By way of example, a flash storage device, a blocking capacitor, a voltage regulator, a current supply, a clock and/or a protective circuit may be used as allocated electronic components (12). The corresponding components may also be used in multiple embodiments.

Figure 8:
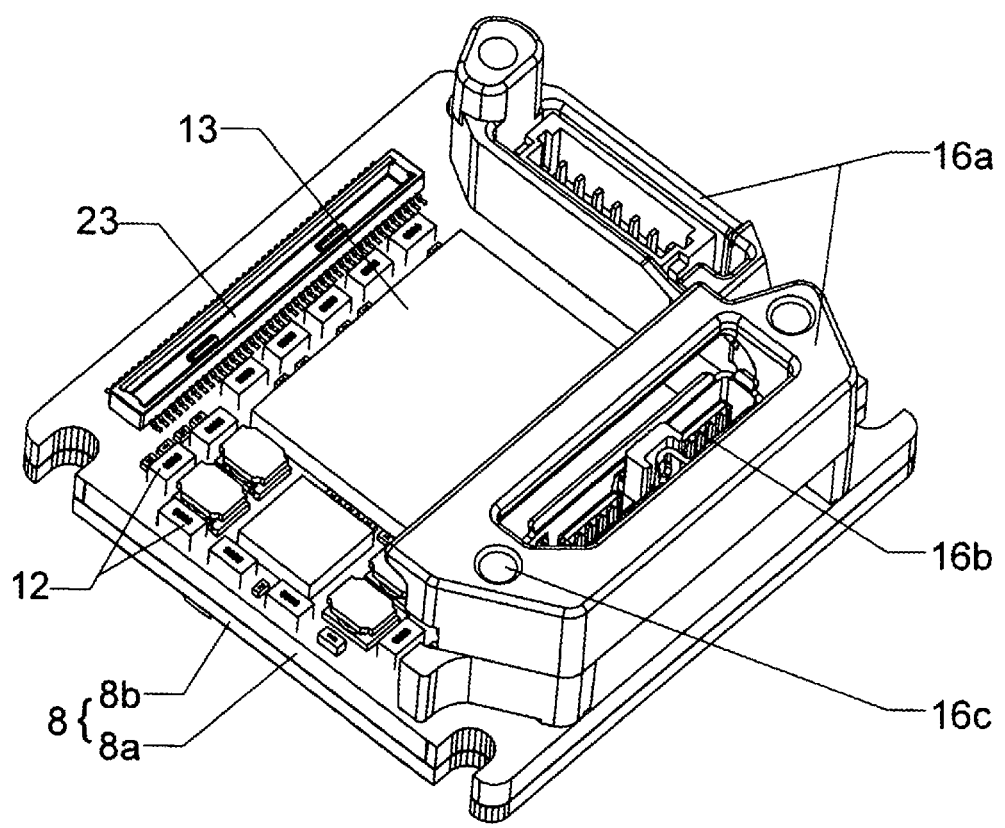
FIG. 8 illustrates a circuit board stack, in accordance with the invention, of a digital camera having a fastening element.

In accordance with the illustration in FIG. 8, in addition to the main chip (13) and the further electronic components (12), a plug connector (23) and two external connecting devices (16) having a fastening element (16a) are arranged on the main circuit board (8a) of the circuit board stack (8).

The plug connector (23) is used as a connecting possibility for an optional expansion circuit board (18), as is illustrated in FIG. 5.

The connecting devices of the interfaces (16) comprise in the illustrated advantageous embodiment respectively an electrical connecting device (16b) that realizes the actual socket contact and that is at least electrically connected to the main circuit board (8a). Such a socket may realize by way of example a USB interface, a CSI-2 interface or an I/O interface. The allocated fastening element (16a) is arranged in the region of an electrical connecting device (16b) and is fastened to the main circuit board (8b) and/or the circuit board stack (8) by way of example by means of a soldering procedure and/or a mechanical connection.

A fastening element (16a) is advantageously produced from a solid material, by way of example cast zinc, and comprises at least one mechanical connecting device (16c) that is embodied by way of example as a screw thread. The single-part fastening element (16a) that is illustrated in FIG. 8 is arranged in a 90° orientation with respect to the main circuit board (8a).

Figure 9:
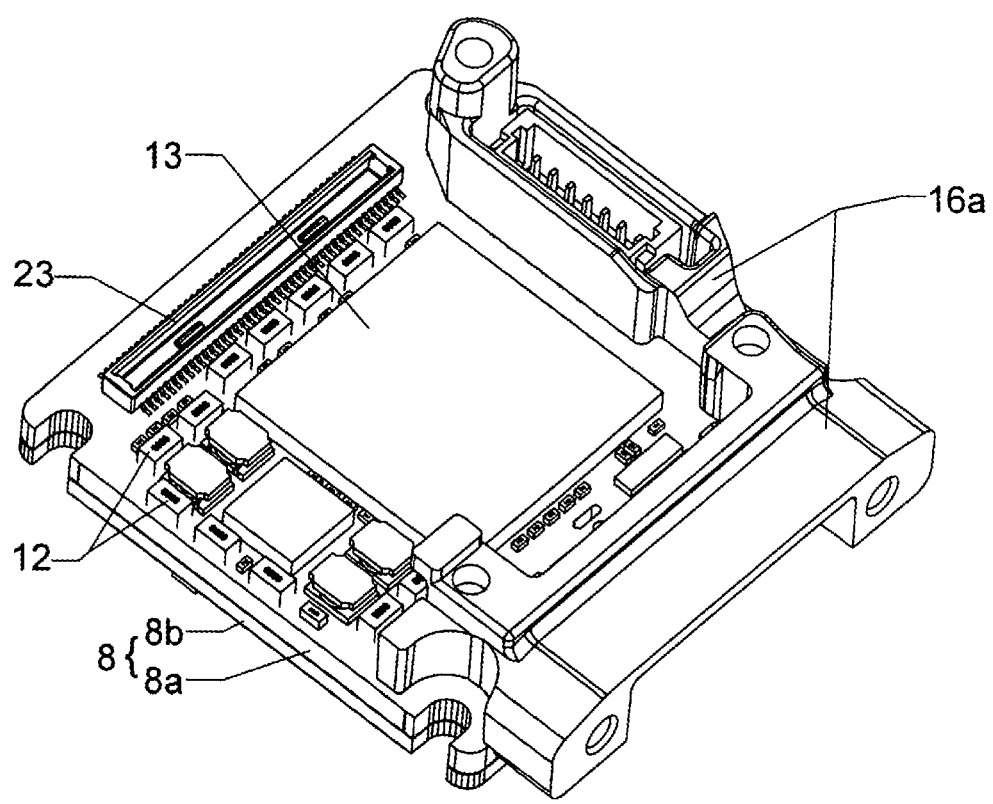
FIG. 9 illustrates a circuit board stack, in accordance with the invention, of a digital camera having an alternative embodiment of the fastening element.

In accordance with the illustration in FIG. 9, an embodiment of the circuit board stack (8), in accordance with the invention, of a digital camera (1) comprising a single-part fastening element (16a) is in regions in a 90° orientation and in regions in a 180° orientation.

Figure 10:
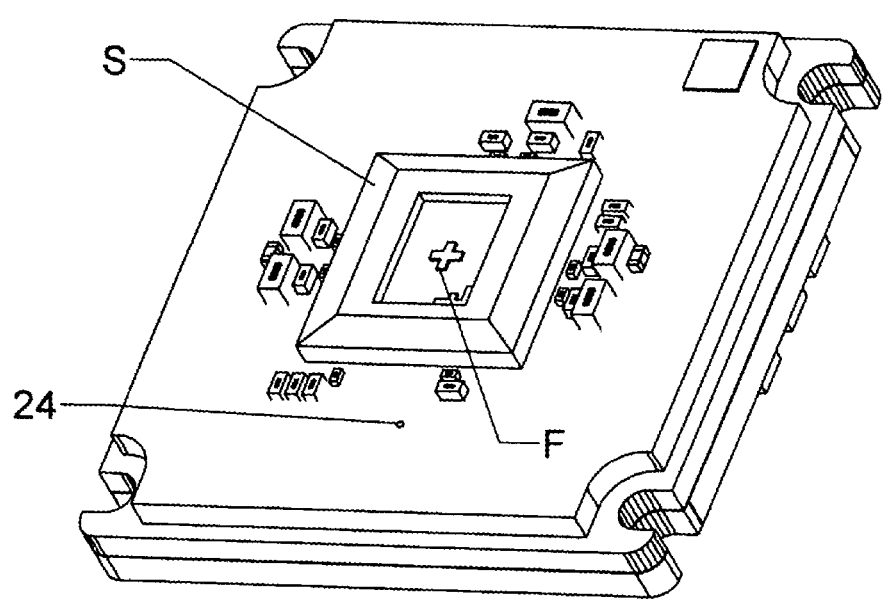
FIG. 10 illustrates a further view of a circuit board arrangement within the camera housing.

FIG. 10 again illustrates in a perspective view the arrangement of an outline milling (14) of the depth (T) in the region of the sensor circuit board (8b) and also the arrangement of a small image sensor (9) on the sensor circuit board (8b). The image sensor (9) comprises an active surface (F). The thickness (D) of the sensor circuit board (8b) that is used is typically adjusted in accordance with the invention to the image sensor (9) that is used. A covering arrangement of the image sensor (9) is typically achieved using a glass plate (not illustrated).

It is possible by means of integrating electronic components (12) between the circuit boards of a circuit board stack (8) to realize a digital camera (1) having a particularly compact construction. In particular, it is possible by means of the effective connection of the main circuit board (8a) and the sensor circuit board (8b) where applicable to minimize the required blocking capacitors. It is possible to perform an in particular direct soldering procedure of the circuit boards so as to avoid plug connectors. The exact positioning of the circuit boards one above the other is provided during the soldering procedure in this case automatically on account of the surface tension of the fluid tin-solder that connects the corresponding solder pad to the circuit boards.

Moreover, it is possible to achieve a particularly good signal integrity in the case of realizing high speed data connections.

Figure 11:
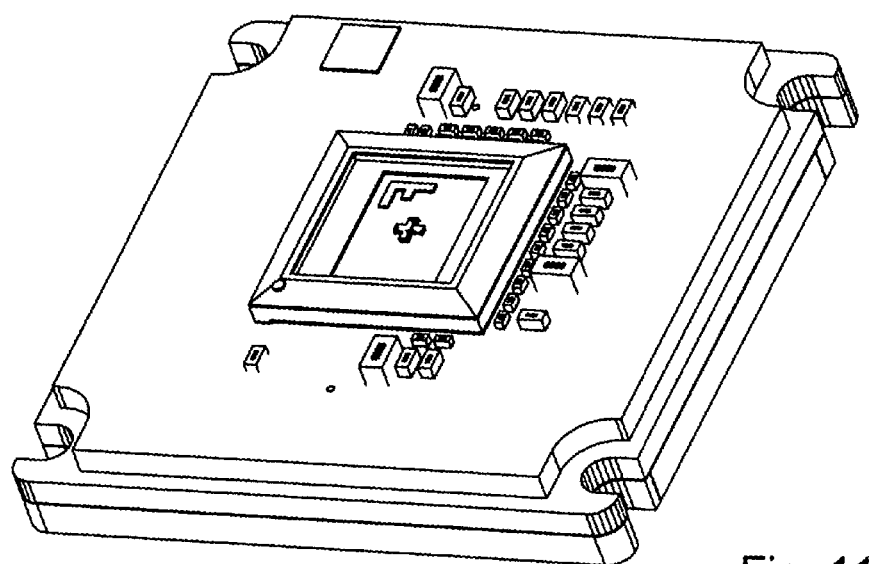
FIG. 11 illustrates the circuit board arrangement in accordance with FIG. having an alternative image sensor.
Figure 12:
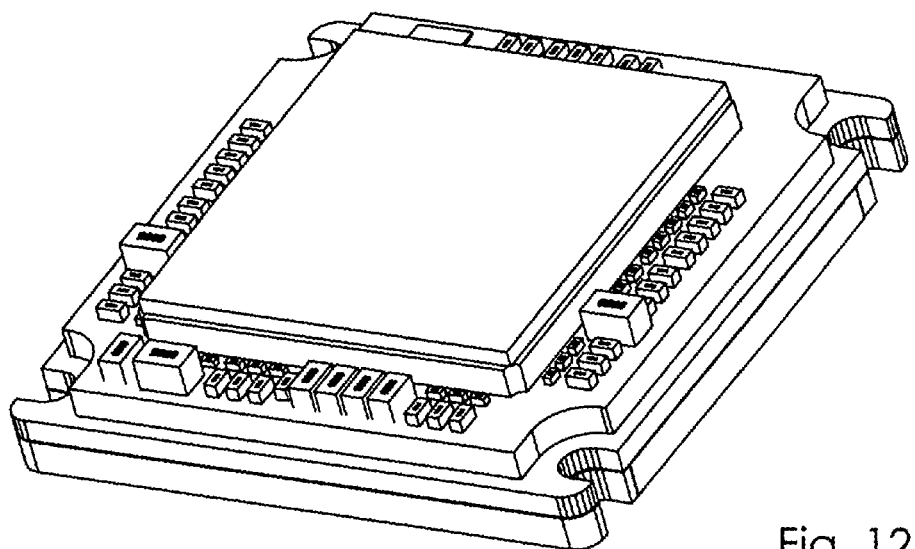
FIG. 12 illustrates the circuit board arrangement in accordance with FIG.

FIG. 11 and FIG. 12 illustrate the circuit board arrangement respectively having image sensors (9) in various dimensions.

Figure 13:
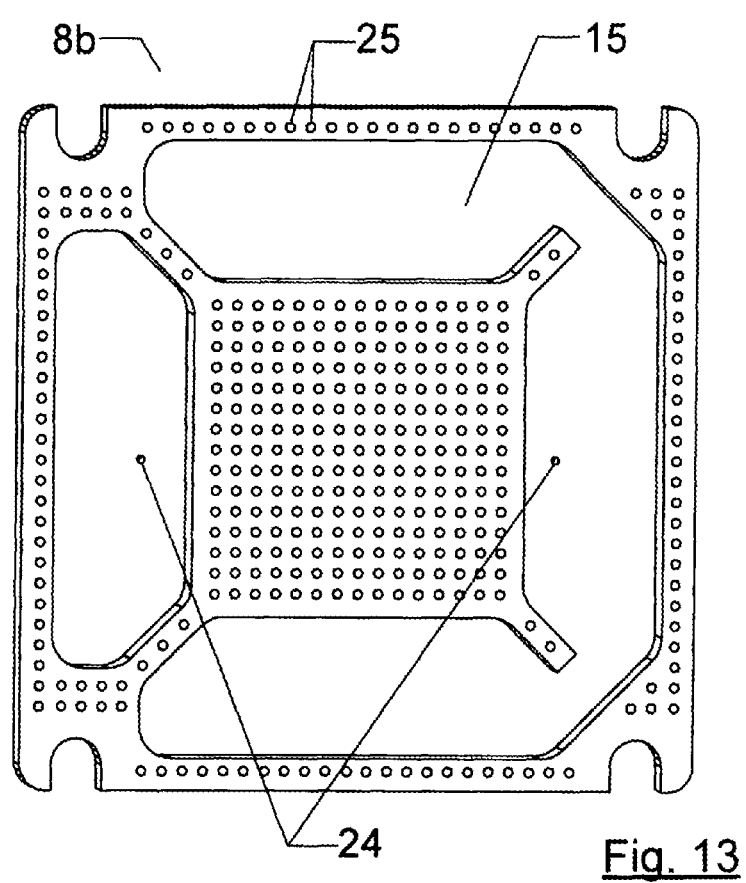
FIG. 13 illustrates a view of a circuit board having soldering regions and depth-milled depressions that are provided.

FIG. 13 illustrates a view of the lower side of a sensor circuit board (8b) in accordance with the invention. The sensor circuit board (8b) comprises two depressions (15) that form two pockets for receiving components (12) that are arranged on another circuit board. In this case, one of the pockets is divided into three subpockets. In the region of the non-milled structure, the sensor circuit board (8b) comprises a plurality of solder pads (25) that are used to form a contacting arrangement with the circuit boards that are to be connected.

Furthermore, two holes are arranged in the region of the depressions (15), said holes being used as ventilation ducts for the space that is delimited between the circuit board stack (8), camera housing (2) and filter or the covering glass and said holes render it possible to equalize pressure. Without the possibility of equalizing pressure, it is possible in the case of a variable environmental pressure for the lens to steam up from the inside. The structure that is formed between the circuit boards of the circuit board stack (8) by means of the soldering connections in this case acts as a filter in the sense of a labyrinth for inflowing air and consequently prevents foreign bodies, such as by way of example dust, being introduced into the region of the image sensor (9).

Figure 14:
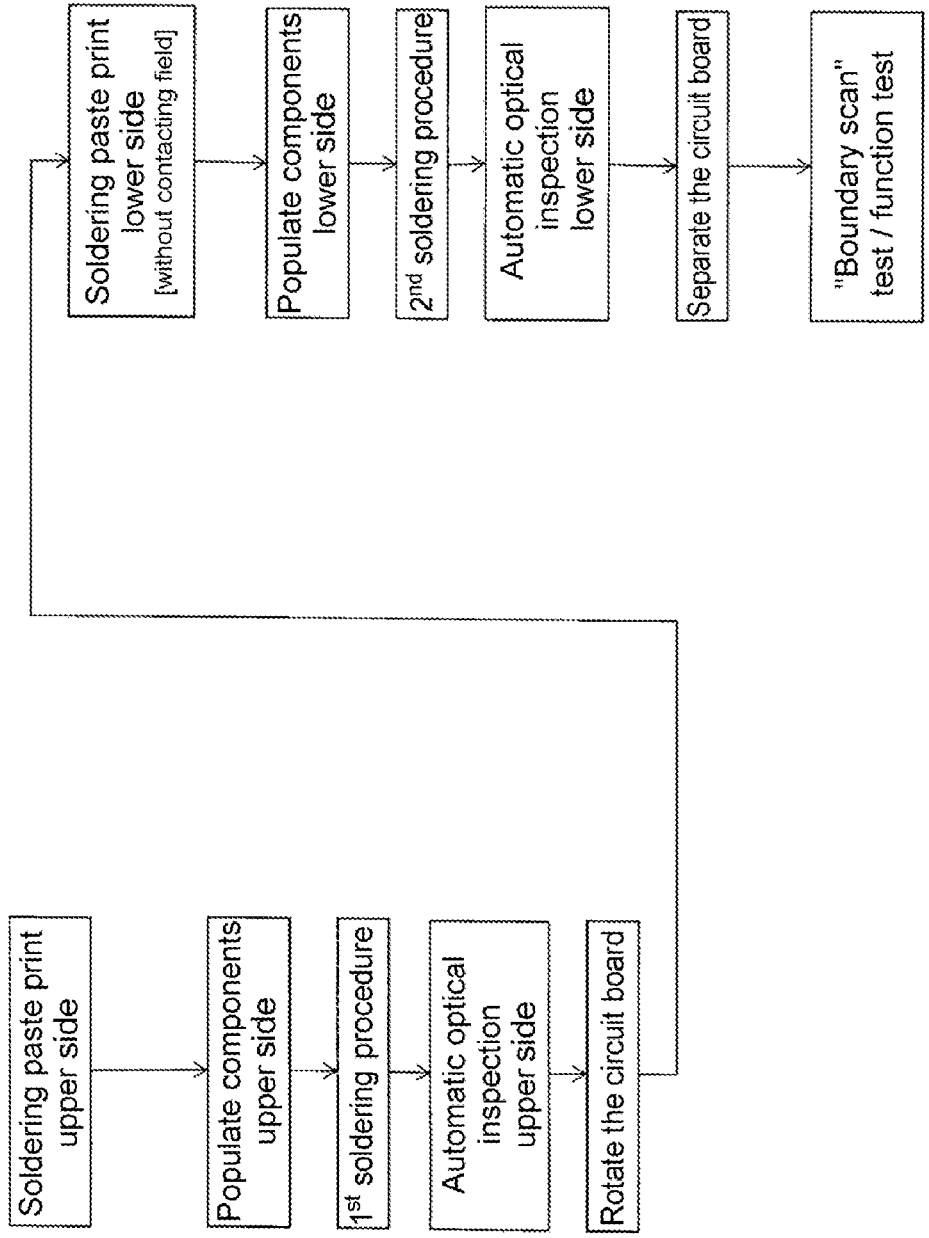
FIG. 14 illustrates a flow diagram for illustrating a production procedure for the main circuit board.

The flow diagram in FIG. 14 illustrates the production procedure for the main circuit board. In a first procedure step, a soldering paste is applied to the upper side of the circuit board. It is preferred that this soldering paste is lead-free. The application procedure is likewise preferably performed in a printing procedure similar to a screen printing procedure using a template. The thickness of the template determines in this case the quantity of the soldering paste that is applied.

After positioning the components that are provided on the upper side of the main circuit board (populating), a first fusing procedure is performed ($1^{st}$ soldering procedure). Afterward, an automated optical inspection of the upper side is performed. After the circuit board is rotated, soldering paste is applied to the lower side of the main circuit board and afterward the components that are provided are positioned in the region of the lower side. A fusing procedure ($2^{nd}$ soldering procedure) is subsequently in turn performed and a further automated optical inspection of the lower side is performed. After performing the optical inspection, the individual circuit boards are separated and the circuit boards that are separated from one another are placed into allocated trays. A test with regard to the connections that are achieved is subsequently performed and finally a function test is performed.

Figure 15:
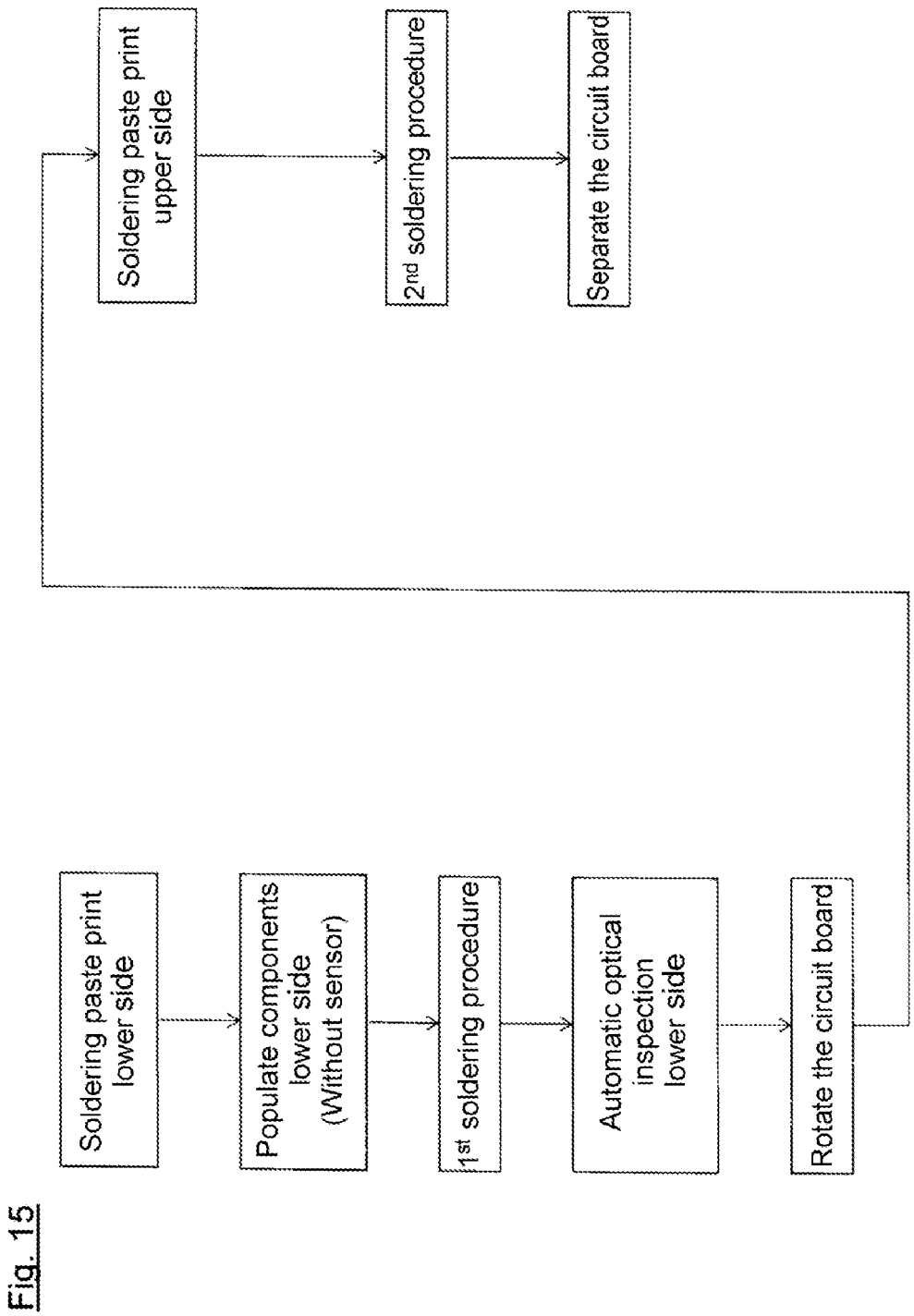
FIG. 15 illustrates a flow diagram for illustrating a production procedure of the sensor circuit board.

FIG. 15 illustrates the production procedure for the sensor circuit board. Here, initially the soldering paste is applied to the lower side of the sensor circuit board and a first fusing procedure is performed. In this case, the circuit board is also subsequently rotated and the soldering paste is applied to the upper side of the sensor circuit board. Afterward, the electronic components that are provided are positioned on the lower side. The sensor is not yet positioned. The fusing procedure is then performed and in this case finally an automated optical inspection of the lower side is also performed. Afterward, the circuit boards are separated from one another and are arranged in trays separately. The soldering paste generally contains tin-solder and a flux.

FIG. 16 illustrates the production procedure for the combination of the circuit boards. An initially empty tray in this case is provided with the main circuit board (main board) and the sensor circuit board is then added. The soldering paste is then applied to the lower side of the sensor circuit board. In a further production step, the sensor circuit board is positioned on the main circuit board and the sensor is added. The flux is then arranged on the lower side of the sensor and the sensor is positioned on the sensor circuit board. Afterward, a fusing procedure is performed for the sensor and finally a function test is performed.

By virtue of the method in accordance with the invention that is illustrated in FIGS. 14 to 16, the relevant image sensors are only put through the soldering procedure once when populating the circuit boards with CMOS image sensors.

The invention components that may be used optionally either individually or in combination with one another are summarized again below.

In a particularly advantageous embodiment of the invention, a device for capturing data is embodied as a digital camera.

Firstly, in accordance with the invention electronic components are integrated into depressions within the circuit board stack in order as a consequence to support a procedure of realizing a compact construction.

Furthermore, it is possible to compensate for height, in particular in relation to the image sensor, by means of at least one outline milling in the region of at least one circuit board.

In accordance with a further invention variant, the mechanical securing arrangement of connecting devices of interfaces is integrated into one or multiple fastening elements that are connected to the circuit board stack and in accordance with a further invention variant a special soldering procedure is performed so as to avoid damaging electronic components by means of the soldering procedure.

Finally, housing parts are connected to one another by means of the use of at least one special resilient clamp in order to render it possible both to reliably connect the housing components as well as to render possible a simple production flow.

With regard to the internal data communication, it is preferred that a corresponding data bus is used. The definition of the individual camera functions and also the provided coordination of the functions are preferably realized via a main chip that is embodied as an ASIC.

The invention claimed is:

1. A device for capturing visual data, said device being embodied as a digital camera, comprising: a camera housing; a lens; a plurality of electronic components in the camera housing, including an image sensor; and at least two circuit boards arranged above one another in the camera housing and soldered to each other so as to form a circuit board stack, wherein the circuit board stack comprises a sensor circuit board on which the image sensor is arranged, and wherein the digital camera comprises a support for the circuit board stack, said support being arranged within the camera housing, wherein the circuit board stack is fixed on the support inside the camera housing by an adhesive, and wherein at least the sensor circuit board has an outline milling arranged on an outer edge region with a depth that compensates for a thickness of the image sensor relative to a fixed reference plane of the digital camera, wherein the depth of the outline milling defines a position of the circuit board stack and the image sensor in the digital camera in conjunction with thickness of the sensor circuit board, the thickness of the image sensor whereby spacing of the image sensor relative to the lens is adjustable in dependence on the thickness of the image sensor so that the image sensor is arrangeable in a defined plane relative to the lens, the support for the circuit board stack and thickness of the adhesive between the support and the circuit board stack.

2. The device according to claim 1, wherein the circuit board stack includes three circuit boards of which one circuit board is a connecting circuit board, wherein the depression for receiving electronic components extends at least in the region of the connecting circuit board.

* * * * *